(12) United States Patent
Fleischer et al.

(10) Patent No.: US 11,626,523 B2
(45) Date of Patent: Apr. 11, 2023

(54) PV DEVICE HAVING IMPROVED OVERALL EFFICIENCY

(71) Applicant: Siemens Energy Global GmbH & Co. KG, Bayern (DE)

(72) Inventors: Maximilian Fleischer, Hohenkirchen (DE); Roland Pohle, Herdweg (DE); Elfriede Simon, Munich (DE); Oliver von Sicard, Munich (DE)

(73) Assignee: Siemens Energy Global GmbH & Co. KG, Bayern (DE)

( * ) Notice: Subject to any disclaimer, the term of this patent is extended or adjusted under 35 U.S.C. 154(b) by 0 days.

(21) Appl. No.: 17/278,293

(22) PCT Filed: Aug. 28, 2019

(86) PCT No.: PCT/EP2019/072922
§ 371 (c)(1),
(2) Date: Mar. 20, 2021

(87) PCT Pub. No.: WO2020/064249
PCT Pub. Date: Apr. 2, 2020

(65) Prior Publication Data
US 2021/0351305 A1 Nov. 11, 2021

(30) Foreign Application Priority Data
Sep. 26, 2018 (DE) ..................... 10 2018 216 485.1

(51) Int. Cl.
*H01L 31/02* (2006.01)
*H02S 50/10* (2014.01)
*H01L 51/42* (2006.01)
*H01L 41/113* (2006.01)
(Continued)

(52) U.S. Cl.
CPC .... *H01L 31/02021* (2013.01); *H01L 51/4213* (2013.01); *H02S 50/10* (2014.12);
(Continued)

(58) Field of Classification Search
CPC ........... H01L 31/02021; H01L 51/4213; H01L 51/4226; H01L 31/032; H01L 31/0481;
(Continued)

(56) References Cited

U.S. PATENT DOCUMENTS

2018/0226200 A1    8/2018  Uchida
2018/0248061 A1*   8/2018  Bullen .................. H01L 51/448

FOREIGN PATENT DOCUMENTS

CN     107316942 A  *  11/2017  ......... H01L 51/4226
CN     107359860 A     11/2017
(Continued)

OTHER PUBLICATIONS

Tress, W., N. Marinova, T. Moehl, S. M. Zakeeruddin, Mohammad Khaja Nazeeruddin, and M. Grätzel, Understanding the rate-dependent J-V hysteresis, slow time component, and aging in CH3NH3PbI3 perovskite solar cells: the role of a compensated electric field, Energy Environ. Sci., 2015, 8, 995.
(Continued)

*Primary Examiner* — Michael Y Sun
(74) *Attorney, Agent, or Firm* — Wolter Van Dyke Davis, PLLC

(57) ABSTRACT

A photovoltaic device having a perovskite PV cell wherein the PV device operates, for example during start-up, initially in a bias-voltage operating mode, in which a bias voltage is applied to the perovskite PV cell of the PV device. The bias voltage or the energy needed for same can advantageously be drawn from the power electronics associated with the perovskite PV cell.

19 Claims, 1 Drawing Sheet

(51) Int. Cl.
| | |
|---|---|
| *H01L 45/00* | (2006.01) |
| *H01L 31/032* | (2006.01) |
| *H01L 51/44* | (2006.01) |
| *H01L 31/048* | (2014.01) |

(52) U.S. Cl.
CPC ........ *H01L 31/032* (2013.01); *H01L 31/0481* (2013.01); *H01L 41/1132* (2013.01); *H01L 45/147* (2013.01); *H01L 51/4206* (2013.01); *H01L 51/448* (2013.01)

(58) Field of Classification Search
CPC ............... H01L 41/1132; H01L 45/147; H01L 51/4206; H01L 51/448; H02S 50/10; H02S 50/00; Y02E 10/549
See application file for complete search history.

(56) References Cited

FOREIGN PATENT DOCUMENTS

| WO | 2016005092 A1 | 1/2016 |
|---|---|---|
| WO | 2016005101 A1 | 1/2016 |
| WO | 2017212968 A1 | 12/2017 |
| WO | 2018162496 A1 | 9/2018 |

OTHER PUBLICATIONS

De Bastiani, Michele, et al., Ion Migration and the Role of Preconditioning Cycles in the Stabilization of the J-V Characteristics of Inverted Hybrid Perovskite Solar Cells; m Adv. Energy Mater. 2016, 6, 1501453; DOI: 10.1002/aenm.201501453.

Deng, Yehao, Zhengguo Xiao, and Jinsong Huang; Light-Induced Self-Poling Effect on Organometal Trihalide Perovskite Solar Cells for Increased Device Efficiency and Stability; Adv. Energy Mater. 2015, 5, 1500721; 2015.

Dunbar, Ricky B., et al., Device pre-conditioning and steady-state temperature dependence of CH3NH3PbI3 perovskite solar cells; Progress in Photovoltaics: Research and Applications; Prog. Photovolt: Res. Appl. 2017; 25:533 544; Copyright © 2016 John Wiley & Sons, Ltd.; 2016.

PCT International Search Report and Written Opinion of International Searching Authority dated Jan. 14, 2020 corresponding to PCT International Application No. PCT/EP2019/072922 filed Aug. 28, 2019.

* cited by examiner

PV DEVICE HAVING IMPROVED OVERALL EFFICIENCY

CROSS REFERENCE TO RELATED APPLICATIONS

This application is the US National Stage of International Application No. PCT/EP2019/072922 filed 28 Aug. 2019, and claims the benefit thereof. The International Application claims the benefit of German Application No. DE 10 2018 216 485.1 filed 26 Sep. 2018. All of the applications are incorporated by reference herein in their entirety.

FIELD OF INVENTION

The invention relates to a photovoltaic device and in particular to the efficiency of a device of this type.

BACKGROUND OF INVENTION

Solar power generation with the means of photovoltaics (PV) is contributing at a rapidly increasing rate to the production of electricity due to environmental and increasingly also economic reasons, for example in Central Europe. All over the world, there is a great number of PV installations already installed which are predominantly building upon conventional approaches with silicon-based PV cells. However, for a number of years, so called perovskite materials, such as CH3NH3PbI3 (or more generally (CH3NH3) MX3-xYx (where M=Pb or Sn and X,Y=I, Br or Cl)), for example, have been examined, with regard to their application in PV cells, which allow a highly efficient conversion of electromagnetic radiation energy into electrical energy, owing to their optoelectronic properties. Perovskite-based PV cells are characterized on the one hand by the fact that they are comparatively cost effective. On the other hand, the perovskite PV cells represent a serious alternative to the conventional silicon-based PV cells, since the progress made in recent years with regard to its degree of effectiveness, which is influenced by the so called "photo conversion efficiency" (PCE), from a few percent to more than 20% today, indicates that degrees of effectiveness or efficiencies which significantly exceed those of conventional PV cells can be achieved. In this case, it is conceivable to operate a perovskite PV cell on its own or, however, in a tandem PV module or in combination with a conventional silicon PV cell. The latter is described in PCT/EP2018/055499, for example.

However, despite the promising development, an underlying problem of perovskite PV cells is that their degree of effectiveness is not constant. In particular, it has been determined that they show a so called running-in behavior or also switch-on behavior which is characterized by the fact that the efficiency, for example when starting up the PV cell, does not initially correspond to the optimum, but rather this is achieved only after some time. The term "start-up" should therefore not only include the first start-up after initial installation of the PV cell but also restarting after a temporary deactivation of the PV cell, for example, as well as situations in which the PV cell has not supplied any electrical energy for lack of lighting, for example during the night. In other words, the start-up therefore generally comprises the transition of the operating state of the PV cell from an inactive state to an active state, wherein the PV cell does not supply a significant amount of electrical energy in the inactive state. In contrast to this, the PV cell provides electrical energy in the active state to any significant degree as a result of a light-sensitive component of the PV cell being lit.

The effect that the optimum efficiency of the respective PV cell is only achieved after some time has a negative impact on the overall efficiency of the PV device.

SUMMARY OF INVENTION

It is therefore an object of the present invention to specify one possibility for achieving a perovskite PV cell with an as far as possible stable efficiency, so that the overall efficiency is improved.

This object is achieved by the PV device as described and the operating method as described in the independent claims. The subclaims describe advantageous configurations.

One corresponding PV device has a perovskite PV cell for converting light L which falls onto the perovskite PV cell into an electrical output voltage U1 which can be tapped at electrical connections of the perovskite PV cell. Moreover, a control unit for operating the PV device is provided, wherein, in particular for regulating the operation of the perovskite PV cell as part of the PV device, a power electronics of the PV device is in fact regulated which is associated with the PV cell and to which the electrical voltage U1, which is generated by the PV cell when lit, is supplied via a corresponding electrical line. The control unit is now set up to monitor the PV device with regard to the occurrence of a situation from a list of specific situations, for example a start-up, and to operate it in such a way that in the case of the specific situation occurring, a bias voltage operating state of the PV device is triggered for a predetermined period, in which operating state an electrical bias voltage from an energy source is applied to a light-sensitive component of the perovskite PV cell. After terminating the bias voltage operating state, the PV device transitions to the normal operating state in which the perovskite PV cell provides the output voltage U1.

It has been identified that the running-in behavior or switch-on behavior when starting up or in other equivalent specific situations appears to be associated with a conditioning of the PV cell at the point in time of the start-up. The state in which the perovskite PV cell finds itself, for example when starting up, is therefore particularly important. This state can be influenced according to the invention by the electrical bias voltage being applied to the perovskite PV cell or to the light-sensitive component thereof for the predetermined period, for example for a few seconds. This results in the efficiency not being substantially below the optimum efficiency of the cell after the predetermined period has expired. Since the optimum efficiency is achieved in this way after a certain period of typically a few seconds, the bias voltage can be switched off after the predetermined period mentioned above after start-up or the like. The bias voltage can be in a range of 1.2V-2.0V, for example, and can therefore be relatively significantly higher than the typical operating voltage of approximately 0.8V.

Advantageously, the power electronics of the PV device, which, at least in a normal operating state of the PV device, converts the electrical output voltage U1, which is provided by the perovskite PV cell when lit with light L, into an output voltage U2 which can be tapped at an output of the power electronics, represents the energy source. In other words, the already present power electronics, operated by the control unit, therefore provides the bias voltage which is to be applied to the perovskite PV cell. Additional components are therefore not necessary.

In particular, the energy source can be an energy storage device from which the energy which is required for providing the bias voltage can be obtained. Alternatively, the energy source could also be realized by a connection to a public or non-public power grid, for example.

The energy storage device is ideally incorporated into the power electronics, i.e. into the circuit of the power electronics, and in particular designed as a capacitor, for example as a so called "supercap", or as a battery. For example, PCT/EP2015/061129 or even PCT/EP2015/061932 show power electronics circuits with energy storage devices incorporated into their intermediate circuits. In this case, a power optimizer of an inverter or the incorporated energy storage device thereof can also be used.

The control unit is now set up to operate the PV device in such a way that at least one part of the voltage $U1$, which is provided by the perovskite PV cell when lit with light L, can be used for recharging the energy storage device at the latest after the predetermined period or after terminating the bias voltage operating state. This does not have to occur directly after the predetermined period, but rather it may also only be initiated by the control unit if the energy requirement of a consumer supplied by the PV cell is lower than the electrical energy which is currently provided by the PV cell, for example.

Moreover, the control unit can be set up to operate the PV device in such a way that the bias voltage in the bias voltage operating state is applied constantly or in a pulsed manner to the perovskite PV cell or else that a predetermined charge quantity flows into the perovskite PV cell. In the case of pulsed application, a sequence of bias voltage pulses is applied in such a way that no bias voltage is applied between two consecutive bias voltage pulses in each case. In this case, a parameter which represents the instantaneous efficiency of the perovskite PV cell is measured at least between some of the bias voltage pulses, i.e. while no bias voltage is present. In the event that the measured instantaneous efficiency is greater than a predetermined threshold value, the bias voltage operating state is terminated and the normal operating state is triggered. This has the advantage that it is possible to optionally transition earlier to the normal operating state.

The list of specific situations comprises, for example, a start-up of the perovskite PV cell and/or a lack of lighting of the perovskite PV cell, wherein a light sensor for measuring lighting which falls onto the perovskite PV cell is provided, wherein the light sensor is connected to the control unit in order to transmit sensor data to the control unit, and the control unit is set up to evaluate the sensor data and to compare them with a lighting threshold value, wherein the predetermined situation of lack of lighting of the perovskite PV cell is present when the lighting threshold value is fallen short of. Moreover, the list can comprise a situation in which a measured variable which represents the instantaneous efficiency of the perovskite PV cell falls below a predetermined efficiency threshold value (EFFmin) of the perovskite PV cell. A representative measured value of this type can be the so called "maximum power point" of the instantaneous current-voltage characteristic of the PV cell or else the actual efficiency which can be determined based on a comparison of the radiation power which falls onto the perovskite PV cell with the power which is correspondingly provided by the PV cell, for example. Furthermore, the list can comprise a situation in which the instantaneous output voltage $U1$ of the perovskite PV cell falls below a predetermined minimum output voltage $U1min$, wherein a voltmeter for measuring the output voltage $U1$ of the perovskite PV cell is provided, wherein the voltmeter is connected to the control unit in order to transmit voltage measurement data to the control unit, and the control unit is set up to evaluate the voltage measurement data and to compare them with a voltage threshold value, wherein the predetermined situation of falling below the predetermined minimum output voltage $U1$ is present when the voltage threshold value is fallen short of. One further conceivable specific situation can be an expiration of a predetermined time span since the last occurrence of a predetermined situation, i.e. the bias voltage would essentially be applied regularly or periodically. In particular, the specific situations of the start-up and of the expiration of the predetermined time span since the last occurrence of a specific situation can be monitored by the control unit without special additional tools by said control unit being equipped with appropriate control/regulation software which registers situations of this type.

In one method for operating a PV device of this type, the PV device is monitored with regard to the occurrence of a situation from a list of specific situations. In the case of one of the specific situation occurring, a bias voltage operating state of the PV device is triggered for a predetermined period, in which operating state an electrical bias voltage from an energy source is applied to a light-sensitive component of the perovskite PV cell.

In this case, the bias voltage which is to be applied to the perovskite PV cell in the bias voltage operating state is advantageously provided by a power electronics of the PV device, so that the power electronics, which, at least anyway in a normal operating state of the PV device, converts an electrical output voltage $U1$, which is provided by the perovskite PV cell when lit with light L, into an output voltage $U2$ which can be tapped at an output of the power electronics, therefore represents the energy source. In this case, the actual energy source is in particular an energy storage device which is incorporated into the power electronics, for example a battery or a capacitor. In general, the energy source can be an energy storage device from which the energy which is required for providing the bias voltage is obtained.

At least one part of the voltage $U1$, which is provided by the perovskite PV cell when lit with light L, is used for recharging the energy storage device after the predetermined period or after terminating the bias voltage operating state.

As already mentioned, the operating method makes provision for the bias voltage in the bias voltage operating state to be applied constantly or in a pulsed manner to the perovskite PV cell or in such a way that a predetermined charge quantity flows into the perovskite PV cell. In the event of pulsed application, a sequence of bias voltage pulses is applied in such a way that no bias voltage is applied between two consecutive bias voltage pulses in each case, wherein a parameter which represents the instantaneous efficiency of the perovskite PV cell is measured at least between some of the bias voltage pulses, i.e. while no bias voltage is present. In the event that the measured instantaneous efficiency is greater than a predetermined threshold value, the bias voltage operating state is terminated and the normal operating state is triggered.

Moreover, the operating method makes provision for the list of specific situations to comprise at least a start-up of the perovskite PV cell, a lack of lighting of the perovskite PV cell, a situation in which a measured variable which represents the instantaneous efficiency of the perovskite PV cell falls below a predetermined efficiency threshold value (EF- Fmin) of the perovskite PV cell, a situation in which the instantaneous output voltage U1 of the perovskite PV cell falls below a predetermined minimum output voltage U1min, and/or an expiration of a predetermined time span since the last occurrence of a specific situation.

In particular in the case of the specific situation of lack of lighting of the perovskite PV cell occurring, the bias voltage operating state is only triggered if a lighting measured value exceeds a further lighting threshold value BS' after falling below the lighting threshold value BS. In this case, BS and BS' can be identical. This ensures that the bias voltage operating state is only triggered if it can be anticipated that the lighting is sufficient for normal operation of the perovskite PV cell.

Further advantages and embodiments are set forth in the drawings and the corresponding description.

With regard to the phrases "for operating the PV device" or "that the control unit is set up to operate the PV device in such a way" etc., i.e. phrases in which the control unit is intended to "operate" the PV device or one of its components, it should be noted that the respective operation is regulating or controlling the component operated in each case depending on the situation and requirements. It is assumed that it will be clear to a person skilled in the art whether the control unit is controlling or regulating, for example, in the respective situation, depending on the situation and requirements.

The invention and exemplary embodiments are explained in greater detail hereinafter using drawings. Therein, the same components are characterized in different figures by the same reference numbers. It is therefore possible that in the description of a second figure, there are no further explanations for a specific reference number which has already been explained in the context of a different, first figure. In such a case, it can be assumed for the embodiment of the second figure that the component characterized therein with this reference number has the same properties and functionalities as explained in the context of the first figure, even without further explanation in the context of the second figure. Moreover, for the sake of clarity, sometimes not all reference numbers are represented in all of the figures but rather only those which are referred to in the description of the respective figure.

BRIEF DESCRIPTION OF THE DRAWINGS

In the figures.

DETAILED DESCRIPTION OF INVENTION

For clarification of terms, it should be noted in advance that terms such as "above", "below", "over", "on", "under" etc. in the respective context refer to a coordinate system in which the source of the light which is to be converted by the PV cell into electrical voltage, i.e. the sun, for example, is located "above" or "over" the PV cell.

Figure 1:
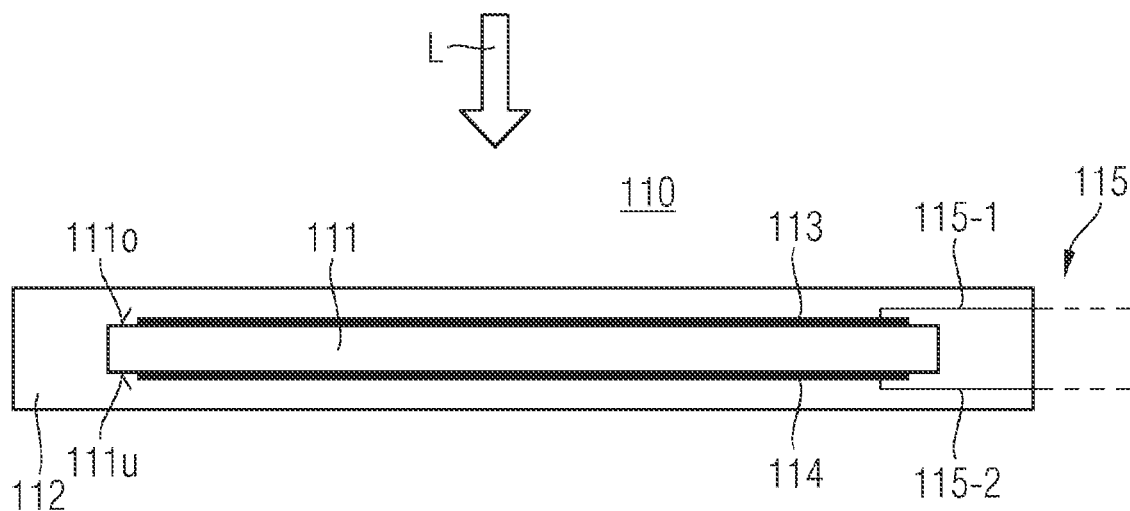
FIG. 1 shows a perovskite PV cell.
Figure 2:
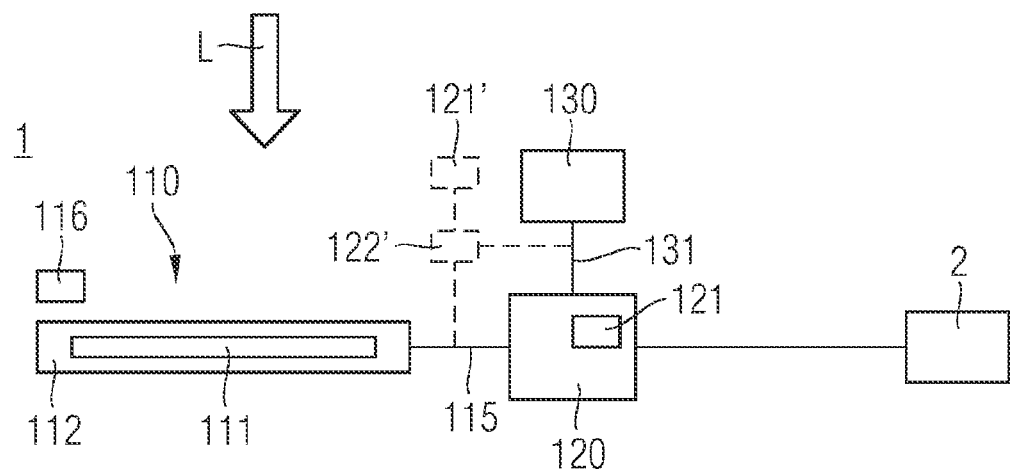
FIG. 2 shows a PV device.

FIG. 1 shows a PV cell 110 in an exemplary and simplified manner. The PV cell 110 has a light-sensitive component 111 which is embedded in a carrier 112, for example glass. The light-sensitive component 111, which provides an electrical voltage U1 when irradiated with light L, which thus converts the light L which falls onto the perovskite PV cell 110 into an electrical output voltage U1, essentially consists of a perovskite material as was described at the outset, hence why the PV cell 110 is also subsequently referred to as a "perovskite PV cell". In practice, the light-sensitive component 111 consists of a plurality of layers, in particular including an essential layer made of the perovskite material, wherein, however, the precise layer composition of the PV cell 110 does not play an essential role within the context discussed here and is therefore not explained in greater detail. Moreover, the general mode of operation of a PV cell and in particular that of a light-sensitive component are sufficiently known and are therefore likewise not explained in greater detail hereinafter. It is merely mentioned that the electrical output voltage U1 generated in the light-sensitive component 111 as a result of irradiation with light L can be tapped at electrodes 113, 114 of the PV cell. In practice, the electrodes 113, 114 typically extend over the entire upper or lower surface 111$o$, 111$u$ of the light-sensitive component 111. In this case, the electrode 113 at the surface 111$o$, which faces the light L or the corresponding, not specifically represented light source, of the light-sensitive component 111 is at least transparent for that part of the spectrum of light L for which the light-sensitive component 111 has its maximum efficiency. This therefore partially transparent material can be Spiro-OMeTAD doped with Li-TFSI, for example. In contrast, the electrode 114 at the lower surface 111$u$ of the light-sensitive component 111 does not have to be transparent and can consist of gold, for example. Moreover, the perovskite PV cell 110 has an electrical connection 115 with lines 115-1, 115-2 with which the PV cell 110, as indicated in FIG. 2, can be connected to a power electronics 120, in order to provide the voltage U1 which is generated with lighting to the power electronics 120. The power electronics 120 is typically designed as an inverter which converts the DC voltage U1 provided by the perovskite PV cell 110 into an AC voltage U2 which is suitable for a consumer 2.

FIG. 2 shows, in an exemplary and simplified manner, a PV device 1 with a perovskite PV cell 110 as explained in FIG. 1 and with the power electronics 120 already mentioned. Moreover, the PV device 1 comprises a control unit 130 which is set up to operate the PV device 1 depending on the desired or required operating mode. In this case, in particular for regulating the operation of the perovskite PV cell 110 as part of the PV device, the power electronics 120 is in fact regulated which, on the one hand, is connected to the control unit 130 via a data connection. On the other hand, the power electronics 120 is associated with the PV cell 110, and the electrical voltage U1, which is generated by the PV cell 110 when lit, is supplied to the power electronics 120 via the electrical line or the connection 115.

In particular, the control unit 130 distinguishes between a normal operating state or "normal operation" and a bias voltage operating state. During normal operation of the PV device 1, the perovskite PV cell 110 is lit with light L and generates the output voltage U1. This is supplied to the power electronics 120 and, depending on requirement and operation, is converted into an electrical voltage U2 there by the control unit 130 which is finally provided to the electrical consumer 2. During normal operation, the PV device 1 and in particular the perovskite PV cell 110 operates at normal efficiency EFF(t)=EFFnorm which ideally corresponds to the maximum achievable efficiency EFFmax. However, as was explained at the outset, after a period of an absence of lighting or at most very weak lighting, for example after a start-up of the PV cell 110 at a point in time T0, a certain period elapses initially until the efficiency EFF achieves the normal efficiency EFFnorm at a point in time T1. EFF(t')<EFFnorm therefore essentially applies to a period T0≤t'≤T1, while EFF(t)=EFFnorm applies to t>T1.

In other words and in particular in a generalized manner, in the case of a specific situation occurring, in the example given in the case of a start-up, and for a further certain period thereafter, the efficiency EFF of the perovskite PV cell 110 is therefore lower than the efficiency EFFnorm which is to be expected during normal operation.

The control unit 130 is now set up to monitor the PV device 1 with regard to the occurrence of a specific situation of this type and to operate it in such a way that in the case of the specific situation occurring, the bias voltage operating state of the PV device 1 is triggered for a predetermined period dT, which will typically last several seconds. In the bias voltage operating state, an electrical bias voltage in a range of 1.2V-2.0V, for example, from an energy source 121 is applied to the perovskite PV cell 110 or to the light-sensitive component 111 thereof and in particular via the electrodes 113, 114. The bias voltage induces an ionic migration within the light-sensitive component 111, which causes the buildup of an electrical field, which has a positive impact on the efficiency EFF(t), in particular if the normal efficiency EFFnorm has not yet been achieved.

Switching off the bias voltage also terminates the bias voltage operating state and the PV device 1 transitions to normal operation in which the perovskite PV cell 110 provides an output voltage U1 which is supplied to the power electronics 120 in a conventional manner for further processing, and in which the PV device 1 in particular operates with normal efficiency EFFnorm and with normal efficiency.

The energy source 121 is ideally incorporated into the already present power electronics 120. In this case, the term "incorporated" is intended to be understood to mean that the energy source 121 is not merely accommodated in a housing of the power electronics 120, for example. In fact, "incorporated" means that the energy source 121, which in this case is designed in particular as a battery or as a capacitor, is incorporated into the circuit of the power electronics 120 in a circuit-related manner. The energy source 121 can particularly advantageously be a component which is already provided in the circuit of the power electronics 120. As already explained previously, PCT/EP2015/061129 and also PCT/EP2015/061932 show power electronics circuits with energy storage devices incorporated into their intermediate circuits.

Alternatively to the incorporation into the power electronics 120, the energy source 121 can of course also be a separate energy source 121' which is arranged outside of and independently of the power electronics 120, for example a battery or even a connection to a public or non-public power grid. This is demonstrated in FIG. 2 by the energy source 121' which is indicated with dashed lines and which can be connected to the light-sensitive component 111 via the electrical connection or the connection 115 and the corresponding electrodes 113, 114, for example. Alternatively, the energy source 121' could of course also be connected to the electrodes 113, 114 of the light-sensitive component 111 via a separate, additional connection. However, this is less advantageous in as much as in this case additional effort would be necessary with regard to the corresponding wiring and contacting. Depending on the type of separate energy source 121', an electronic system 122' may be necessary which converts the electrical AC voltage, which is provided by the power grid 121', for example, into the required bias voltage. Here, the electronic system 122', which would be designed as a rectifier in the case described, would be correspondingly operated by the control unit 130.

However, the incorporation of the energy source 121 into the power electronics 120 has the essential advantage over the use of a separate energy source 121' that the already present data connection 131 between the control unit 130 and the power electronics 120 can be used in order to directly operate the energy source 121 in the power electronics 120 in such a way that it supplies the required bias voltage in the specific situations. The use of an energy source which is already present in the electronic circuit of the power electronics 120 is particularly advantageous. Modern power electronics 120 of this type are often connected to so called "power optimizers", or comprise those which are electrically coupled to the inverter 120 and have a component which can be used as an energy source or can itself function as one. This component of the electronic circuit of the power electronics 120 can, in the application described here, be used as a source 121 of electrical energy for providing the bias voltage to the electrodes 113, 114, wherein the correspondingly necessary control or regulation is performed by the control unit 130. In the case described the power electronics 120 thus does not have to be changed but rather the available electronic circuit is used.

During operation of the PV device 1, the control unit 130 operates in such a way that it transfers the PV device 1 back into the normal operating state at the latest after the predetermined period dT in which the PV device 1 is in the bias voltage operating state, so that it operates in normal operation. Advantageously, during normal operation, at least one part of the output voltage U1, which the perovskite PV cell 110 generates during normal operation, is now used for recharging the energy storage device 121. This does not have to occur directly after the predetermined period dT, but rather it may also only be initiated by the control unit 130 if the energy requirement of the consumer 2 supplied by the PV device 1 is lower than the electrical energy which is currently provided by the PV cell 110, for example.

Moreover, the control unit 130 is set up to operate the PV device 1 and, in the event that the energy source 121 is incorporated into the power electronics 120, in particular the power electronics 120 in such a way that the bias voltage is applied constantly to the light-sensitive component 111 of the perovskite PV cell 110 or to the corresponding electrodes 113, 114 during the predetermined period dT.

In a first alternative to this, the control unit 130 can also operate in such a way that the bias voltage is applied in a pulsed manner. In this case, a time series of bias voltage pulses is applied to the electrodes 113, 114, wherein no voltage is applied to the electrodes 113, 114 between two consecutive pulses. In this case, a measurement, for example of the degree of effectiveness or of the current-voltage characteristic or of another variable which represents the instantaneous efficiency of the perovskite PV cell 110, can optionally take place in each case between two bias voltage pulses. If this measurement shows that the measured efficiency EFF(t) achieves a predetermined threshold value which essentially corresponds to the normal efficiency EFFnorm, for example, the bias voltage operating state may optionally be terminated early, i.e. before expiration of the predetermined period dT.

In a second alternative, the bias voltage is applied in such a way that a predetermined charge quantity flows into the perovskite PV cell 110 or into the light-sensitive component 111. Since, as already mentioned at the outset, it is to be assumed that the ionic migration in the light-sensitive component 111 plays an essential role in the efficiency which is initially reduced and in the advantageous effectiveness of the bias voltage, the control of the charge which flows into the light-sensitive component 111 in the bias voltage operating state allows an even more precise setting of the operating conditions of the PV cell 110 than in the case of applying the constant bias voltage.

In the example mentioned above, the specific situation, the occurrence of which is the prerequisite for triggering the bias voltage operating state of the PV device 1, is a start-up of the PV device 1 as it was defined at the outset. In the case of such a start-up, the control unit 130 is typically directly involved, since a start-up is generally triggered via the control unit 130 itself. Consequently, monitoring with regard to the occurrence of this specific situation as well as optionally subsequently introducing the measure of applying the bias voltage is not very complex and can be implemented in the simplest case by means of pure software solutions of the operating software of the control unit 130.

However, the specific situation of the start-up is not the only situation in which the PV device 1 transitions to the bias voltage operating state so that an electrical bias voltage is applied to the perovskite PV cell 110. A lack of lighting of the perovskite PV cell 110, for example as a result of clouds or in the case of morning or evening twilight or the like, may also be considered in a first development as a specific situation, the occurrence of which is the prerequisite for triggering the bias voltage operating state of the PV device 1. In order to monitor the PV device 1 with regard to the occurrence of a specific situation of this type of lack of lighting, the PV device 1 has a light sensor 116 which is arranged as close as possible to the light-sensitive component 111 of the perovskite PV cell 110 and which in addition is connected to the control unit 130, in order to transmit sensor data to the control unit 130. The sensor data are a measure of the strength of the lighting of the perovskite PV cell 110 and the control unit 130 is set up to evaluate the sensor data and to compare them with a lighting threshold value BS. When the lighting threshold value BS is fallen short of, it can be assumed that the specific situation of lack of lighting of the perovskite PV cell 110 is present and the control unit 130 can, as in the case of start-up, trigger the bias voltage operating state for the period dT. However, in one advantageous development, triggering the bias voltage operating state in particular only takes place if the instantaneous lighting measured by the light sensor 116 exceeds a predetermined lighting threshold value BS', since otherwise the lighting would not be sufficient for a normal operation and applying the bias voltage would be redundant, since the perovskite PV cell 110 would not operate in an efficient manner anyway. In this case, BS=BS' may apply. In the specific situation of lack of lighting, two points in time TS1, TS2 are therefore ideally examined, namely that point in time TS1 at which the lighting threshold value BS is fallen short of, and that point in time TS2 at which the lighting threshold value BS' is exceeded. Upon determining that the first lighting threshold value BS is fallen short of, the control unit 130 can initially transition to a stand-by mode and only transition from the stand-by mode to the bias voltage operating state when the lighting threshold value BS' is subsequently exceeded. The further method proceeds if the bias voltage operating state is triggered, as already described above, i.e. the bias voltage and with it the bias voltage operating state is terminated after the period dT or, in the case of pulsed application of the bias voltage, optionally if the measured efficiency EFF(t) achieves the predetermined threshold value.

Falling below a predetermined minimum efficiency EFFmin of the perovskite PV cell 110 may also be considered in a second development as a specific situation, the occurrence of which is the prerequisite for triggering the bias voltage operating state of the PV device 1. In this case, a measured variable which represents the instantaneous efficiency of the perovskite PV cell 110 is ascertained and compared with an efficiency threshold value. Possibilities for measuring a measured variable of this type which represents the instantaneous efficiency are specified below. Analogous to the first development, the control unit 130 is also used in the second development in order to monitor the instantaneous efficiency or the corresponding representing measured variable. When the efficiency threshold value is fallen short of, it can be assumed that the specific situation of the instantaneous efficiency of the perovskite PV cell 110 being too low is present, and the control unit 130 triggers the bias voltage operating state for the period dT. The further method proceeds if the bias voltage operating state is triggered, as already described above.

In a similar manner, falling below a predetermined minimum output voltage U1min of the perovskite PV cell 110 may also be considered in a third development as a specific situation, the occurrence of which is the prerequisite for triggering the bias voltage operating state of the PV device 1. The instantaneous output voltage U1 of the perovskite PV cell 110 is applied to the power electronics 120 and it can be assumed that the voltage U1 is also available to the control unit 130. In general, this can be expressed in such a way that the PV device 1 has a voltmeter for measuring the output voltage U1 of the perovskite PV cell 110, wherein the voltmeter is in fact realized by the power electronics 120 in combination with the control unit 130. The voltmeter 120 is connected to the control unit 130 in order to transmit voltage measurement data which represent the instantaneous output voltage U1, and the control unit 130 is set up to evaluate the voltage measurement data and to compare them with a voltage threshold value. When the voltage threshold value is fallen short of, the specific situation of falling below the predetermined minimum output voltage U1min is present and the control unit 130 triggers the bias voltage operating state. The further method proceeds if the bias voltage operating state is triggered, as already described above.

In a fourth development, the expiration of a certain time span since the last occurrence of a specific situation can, in turn, be considered as a specific situation, i.e. the specific situation and with it the bias voltage operating state would, in principle, occur regularly or periodically. The further method proceeds if the bias voltage operating state is triggered, as already described above. In particular, the specific situations of the expiration of the predetermined time span since the last occurrence of a specific situation can, as that of the start-up, be monitored by the control unit 130 without special additional tools by said control unit being equipped with an appropriate software solution of the operating software which registers situations of this type.

It should then be mentioned that one way to measure the instantaneous efficiency of the perovskite PV cell 110 or to ascertain a measured variable which represents the instantaneous efficiency involves measuring an amount of light or irradiance which falls onto the PV cell 110 in the form of a corresponding power and to compare this with the power which is produced by the PV cell 110 as a result of this irradiation. One further possibility for ascertaining a measured variable which represents the instantaneous efficiency of the perovskite PV cell 110 is to determine the instantaneous, so called "maximum power point" (MPP) of the current-voltage characteristic of the perovskite PV cell 110, which describes that point on the current-voltage characteristic at which the PV cell 110 provides the maximum possible power for the given environmental conditions in each case. At a point in time Tx, for example, an instantaneous current-voltage characteristic can therefore be recorded and therein the instantaneous MPP(Tx) can be determined, which is then a measure of the instantaneous efficiency. If this MPP(Tx) is smaller than the MPP(norm) which is assumed to be known, which describes the maximum possible power in a PV cell 110 which is operating in a normal or optimum manner, it must be assumed that the instantaneous efficiency is lower than what is conventional or possible during normal operation. In this case, the absolute value MPP(Tx) is consequently not important, but rather the comparison with a reference value, for example MPP(norm).

Moreover, it should be noted that the "photon conversion efficiency" PCE of the light-sensitive component 111 of the perovskite PV cell 110 above can be assumed as a measure of the efficiency or of the degree of effectiveness of the perovskite PV cell 110, even if it can be assumed that the efficiency of the PV cell 110 does not depend solely on the PCE but rather also on other, partially fixed parameters, such as the type of or the material of the electrodes 113, 114, the arrangement of the electrodes 113, 114 as well as possible further layers of the light-sensitive component 111 which were not mentioned here, for example. However, it is also assumed that the bias voltage applied here essentially affects the PCE and not the other parameters which influence the efficiency. The view that the efficiency is essentially represented by the PCE is therefore justifiable at this point.

REFERENCE NUMBERS

1 PV device
110 perovskite PV cell
111 light-sensitive component
111o upper surface
111u lower surface
112 carrier
113 electrode
114 electrode
115 electrical connection, connection
115-1 electrical line
115-2 electrical line
116 light sensor
120 power electronics
121 energy source, battery, capacitor, supercap
121' energy source, power grid
122' electronic system
130 control unit
131 data connection

The invention claimed is:

1. A photovoltaic (PV) device comprising:
a perovskite PV cell for converting light L which falls onto the perovskite PV cell into an electrical output voltage U1 which can be tapped at an electrical connection of the perovskite PV cell,
a control unit for operating the PV device, and
at least one of a light sensor connected to the control unit and a voltmeter connected to the control unit;
wherein the control unit is set up to monitor the PV device with regard to an occurrence of a specific situation from a list of specific situations and to operate the specific situation in such a way that in a case of the specific situation occurring, a bias voltage operating state of the PV device is triggered for a predetermined period, wherein the bias voltage operating state comprising an electrical bias voltage from an energy source is applied to a light-sensitive component of the perovskite PV cell to improve a photo conversion efficiency (PCE) of the PV device converting the light L into the electrical output voltage U1 based on the specific situation;
and wherein at least one of:
the list of specific situations includes a lack of lighting of the perovskite PV cell, wherein the light sensor for measuring lighting which falls onto the perovskite PV cell is configured to transmit sensor data to the control unit, and the control unit is configured to evaluate the sensor data and to compare the sensor data with a lighting threshold value, wherein the specific situation of lack of lighting of the perovskite PV cell is present when the sensor data falls short of the lighting threshold value, and
the list of specific situations includes an instantaneous output voltage of the perovskite PV cells falls below a predetermined minimum output voltage $U1_{min}$, wherein the voltmeter is configured to transmit voltage measurement data to the control unit and wherein the control unit is configured to evaluate the voltage measurement data and to compare the voltage measurement data with a voltage threshold value, wherein the specific situation of falling below the predetermined minimum output voltage $U1_{min}$ is present when the voltage measurement data falls short of the voltage threshold value.

2. The PV device as claimed in claim 1, wherein power electronics of the PV device, which, at least in a normal operating state of the PV device, converts the electrical output voltage U1, which is provided by the perovskite PV cell when lit with the light L, into an output voltage U2 which can be tapped at an output of the power electronics, represents the energy source.

3. The PV device as claimed in claim 1, wherein the energy source is an energy storage device from which the energy which is required for providing the bias voltage can be obtained.

4. The PV device as claimed in claim 3, wherein the energy storage device is incorporated into power electronics.

5. The PV device as claimed in claim 3, wherein the control unit is set up to operate the PV device in such a way that at least one part of the voltage U1, which is provided by the perovskite PV cell when lit with light L, can be used for recharging the energy storage device at the latest after the predetermined period.

6. The PV device as claimed in claim 1, wherein the control unit is set up to operate the PV device in such a way that the bias voltage in the bias voltage operating state
is applied constantly to the perovskite PV cell or
is applied in a pulsed manner to the perovskite PV cell, wherein a sequence of bias voltage pulses is applied in such a way that no bias voltage is applied between two consecutive bias voltage pulses in each case, wherein a parameter which represents an instantaneous value of the PCE of the perovskite PV cell is measured at least between some of the bias voltage pulses and wherein in an event that the measured instantaneous PCE is greater than a predetermined threshold value, the bias voltage operating state is terminated, or
is applied in such a way that a predetermined charge quantity flows into the perovskite PV cell.

7. The PV device as claimed in claim 1,
wherein the list of specific situations further comprises:
a start-up of the perovskite PV cell and/or
a measured variable which represents an instantaneous value of the PCE of the perovskite PV cell falls below a predetermined efficiency threshold value of the perovskite PV cell, and/or
an expiration of a predetermined time span since a last occurrence of a specific situation.

8. The PV device as claimed in claim 7,
wherein the control unit is set up to operate the PV device in such a way that in the case of the specific situation of lack of lighting of the perovskite PV cell occurring, the bias voltage operating state is only triggered if the sensor data exceeds a further lighting threshold value after falling below the lighting threshold value.

9. A method for operating the PV device as claimed in claim 1, comprising:
monitoring the PV device with regard to the occurrence of the specific situation from the list of specific situations, and
in the case of the specific situation occurring, triggering the bias voltage operating state of the PV device for the predetermined period, in which the bias voltage operating state comprising the electrical bias voltage from the energy source is applied to the light-sensitive component of the perovskite PV cell.

10. The method as claimed in claim 9,
wherein the bias voltage, which is to be applied to the perovskite PV cell in the bias voltage operating state, is provided by a power electronics of the PV device.

11. The method as claimed in claim 9,
wherein the energy source is an energy storage device from which the energy which is required for providing the bias voltage is obtained.

12. The method as claimed in claim 11,
wherein at least one part of the output voltage U1, which is provided by the perovskite PV cell when lit with the light L, is used for recharging the energy storage device after terminating the bias voltage operating state.

13. The method as claimed in claim 9,
wherein the bias voltage in the bias voltage operating state is applied constantly to the perovskite PV cell, or
is applied in a pulsed manner to the perovskite PV cell, wherein a sequence of bias voltage pulses is applied in such a way that no bias voltage is applied between two consecutive bias voltage pulses in each case, wherein a parameter which represents an instantaneous value of the PCE of the perovskite PV cell is measured at least between some of the bias voltage pulses and wherein in an event that the measured instantaneous PCE is greater than a predetermined threshold value, the bias voltage operating state is terminated, or
is applied in such a way that a predetermined charge quantity flows into the perovskite PV cell.

14. The method as claimed in claim 9,
wherein the list of specific situations further comprises:
a start-up of the perovskite PV cell, and/or
a measured variable which represents an instantaneous value of the PCE of the perovskite PV cell falls below a predetermined efficiency threshold value of the perovskite PV cell, and/or
an expiration of a predetermined time span since a last occurrence of a specific situation.

15. The method as claimed in claim 14,
wherein in the case of the specific situation of lack of lighting of the perovskite PV cell occurring, the bias voltage operating state is only triggered if the sensor data exceeds a further lighting threshold value after falling below the lighting threshold value.

16. The PV device as claimed in claim 4,
wherein the energy storage device is designed as a capacitor or as a battery.

17. The PV device as claimed in claim 1, wherein the specific situation comprises a start-up of the perovskite PV cell including one of:
a first startup after initial installation of the PV cell;
a restarting after temporary deactivation of the PV cell; or
situations in which the PV cell has not supplied any electrical energy for lack of lighting.

18. The PV device as claimed in claim 1, wherein the specific situation comprises a measured variable which represents the PCE of the perovskite PV cell falls below a predetermined efficiency threshold value of the perovskite PV cell.

19. The PV device as claimed in claim 1, wherein the perovskite PV cell includes:
a light-sensitive component embedded in a carrier, said light-sensitive component configured to provide the electrical output voltage U1 when irradiated with the light L;
a first electrode that extends over an upper surface of the light-sensitive component facing the light L, said first electrode having a first transparency for a part of a spectrum of the light L; and
a second electrode that extends over a lower surface of the light-sensitive component, said second electrode having a second transparency for the part of the spectrum of the light L that is less than the first transparency.

* * * * *